(12) United States Patent
Kashima et al.

(10) Patent No.: US 9,130,551 B2
(45) Date of Patent: Sep. 8, 2015

(54) DECODER FOR DECODING PWM CODE AND COMMUNICATIONS SYSTEM

(71) Applicant: DENSO CORPORATION, Kariya, Aichi-pref. (JP)

(72) Inventors: Hideki Kashima, Kariya (JP); Tomohisa Kishigami, Obu (JP); Naoji Kaneko, Toyokawa (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/954,069

(22) Filed: Jul. 30, 2013

(65) Prior Publication Data

US 2014/0036987 A1 Feb. 6, 2014

(30) Foreign Application Priority Data

Jul. 31, 2012 (JP) .................................. 2012-170187

(51) Int. Cl.
*H03K 9/08* (2006.01)
*H03K 7/08* (2006.01)
(52) U.S. Cl.
CPC ....................................... *H03K 7/08* (2013.01)
(58) Field of Classification Search
USPC ................... 375/316, 238; 329/312
See application file for complete search history.

(56) References Cited

U.S. PATENT DOCUMENTS

| 5,052,021 | A | 9/1991 | Goto et al. |
| 5,134,632 | A * | 7/1992 | Fletcher et al. ................ 375/238 |
| 7,369,067 | B2 * | 5/2008 | Kishi et al. ...................... 341/53 |
| 2006/0062406 | A1 * | 3/2006 | Kinoshita ...................... 381/113 |
| 2007/0143658 | A1 | 6/2007 | Low et al. |
| 2011/0206067 | A1 * | 8/2011 | Matsuo et al. ................ 370/475 |
| 2013/0094373 | A1 * | 4/2013 | Reidl et al. .................... 370/252 |

FOREIGN PATENT DOCUMENTS

| JP | S48-096063 | 12/1973 |
| JP | 02-305149 | 12/1990 |
| JP | 04-227335 | 8/1992 |
| JP | 07-059182 | 3/1995 |
| JP | 10-311856 | 11/1998 |
| JP | 2006-109294 | 4/2006 |
| JP | 2007-163500 | 6/2007 |

OTHER PUBLICATIONS

Sato, M., "Detailed Description of Vehicle Network System", Dec. 1, 2005, pp. 70-77 w/English translation.
Office Action dated Aug. 19, 2014 in corresponding JP Application No. 2012-170187 with English translation.
Notification of Reasons for Rejection dated Jun. 3, 2014 in corresponding JP Application No. 2012-170187 with English translation.

* cited by examiner

*Primary Examiner* — Siu Lee
(74) *Attorney, Agent, or Firm* — Harness, Dickey & Pierce, PLC

(57) ABSTRACT

A decoder for decoding an input signal coded with a pulse width modulation code as a line code to an output signal in a binary code, has a first memory, a first timer, a determination circuit and a first controller. The information on a duty duration of the PWM code, corresponding to at least one kind of the output signals, is stored on the first memory. The first timer has a capacity to measure the duty duration of the input signal. The determination circuit has a capacity to determining which kind of the output signals corresponds to the input signal, on the basis of the information stored on the first memory and the duty duration measured with the first timer. The first controller has a capacity to updating the information stored on the first memory, on the basis of the determination result and the measured duty duration.

7 Claims, 8 Drawing Sheets

DECODER FOR DECODING PWM CODE AND COMMUNICATIONS SYSTEM

CROSS-REFERENCE TO RELATED APPLICATION

This application is based on and claims the benefit of priority from earlier Japanese Patent Application No. 2012-170187 filed Jul. 31, 2012, the description of which is incorporated herein by reference.

BACKGROUND OF THE INVENTION

1. Technical Field of the Invention

The present invention relates to a decoder for decoding a PWM (pulse width modulation) code and a communications system using the decoder.

2. Related Art

Conventionally, as an in-vehicle communications system, a communications system using a bus transmission line, such as CAN and LIN, is known (refer to, for example, a document 1 (M. Sato, "DETAILED DESCRIPTION OF VEHICLE NETWORK SYSTEM", pp. 70-77, CQ Publishing Co., Ltd., Dec. 1, 2005)).

For communicating efficiently in this kind of communications system, it is desirable that behaviors of transceivers which are provided in nodes for sending and receiving signals via the transmission line are synchronized with each other.

As one of the methods for realizing such synchronization, it is suggested that one node in the communications system transmits on the transmission line signals coded with a line code including a clock component. In this method, the other nodes extract the clock component from the signals on the transmission line, generate a bus clock synchronized with the extracted clock component by processing (frequency dividing, etc.) a self-running clock generated in own nodes, and operate the transceiver according to the bus clock.

As one of the line codes including clock components, a PWM code using two PWM signals different in duty ratio is known. In the waveform of the PWM signals, the signal level changes at an end of a bit and within a bit. Hereinafter, the level change at the end of a bit is referred to a leading edge, and the level change within a bit is referred to a trailing edge. One of the leading and trailing edge is a falling edge, and the other is a rising edge.

As one of decoding method of the PWM code, a method for sampling the signal level after a predetermined interval of the timing of the leading edge is known. That is to say, the two kinds of the PWM signals, used in the PWM code, differ in timing of the trailing edge, therefore a period where the signal levels of the two PWM signals differ from each other occurs. In this decoding method, the sampling timing of the signal level is set within the period, and the two PWM signal are discriminated on the basis of the sampled signal level.

SUMMARY

The inventors found that the waveforms of the signals (described as "input signal" below) inputted into the decoder, especially the timings of the leading and trailing edges, vary between the nodes (transceivers), even when signals having the same waveform on the transmission line are inputted. The timings of the trailing edges of the input signal, based on the timings of the leading edges, are not consistent with those of the signals on the transmission line, and vary between the nodes, because the rising and falling edge are not necessarily delayed uniformly. The reason is that the electric characteristics (threshold for comparing signal levels, delay time of circuit elements, etc.) of the transceivers including the decoders vary between the nodes in the communications systems.

If the time difference between the timings of the trailing edges in the two kinds of input signals is sufficiently secured, compared to the variation between the timings of the trailing edge due to the variation between the electrical characteristics, decoding can be accurately performed by using the fixed sampling time in the decoder.

However, if the time difference cannot be secured sufficiently because of such situations as an increase in transmission rate, a problem shown in FIG. 1 occurs. The problem is that if a common sampling timing Ts is used in each node, depending on the nodes, some nodes can decode the signals properly (node A in FIG. 1), but other nodes cannot decode the signals properly (node B in FIG. 1).

In FIG. 1, for convenience of simple description, the timings of the leading edge in the nodes A and B are the same, but in fact, they are different from each other.

The present disclosure provides a decoder which can decode the pulse width modulation code accurately regardless of the variation between the characteristics of the circuits, and a communications system using the decoder.

An exemplary embodiment provides a decoder for decoding an input signal coded with a PWM (pulse width modulation) code to an output signal in a binary code. The decoder measures the duty duration of the input signal, determines which kind of the output signals corresponds to the input signal. The determination is performed on the basis of the measured duty duration, specifically by comparing information on the measured duty duration of the input signal which is the current determination target with information on the measured duty duration of the input signal other than the determination target, which is received by own decoder. The input signal other than the determination target is, for example, a signal received in the decoder before the determination target.

Here, the duty duration means a measurement target duration when a signal is at a predetermined voltage within a pulse period corresponding to a bit period. It is broadly interpreted, isn't limited to a high level duration compared with a low level duration. For example, according to a protocol in a communications system, if there are a low level duration when a level of a signal is low and a high level duration when a level of a signal is high compared to the low level duration, the low level duration may be measured, alternatively the high level duration may be measured. In following embodiments, leading duration is measured.

DETAILED DESCRIPTION OF THE PREFERRED EMBODIMENTS

This embodiment according to the present invention is described with the drawings below.

[Configuration]

This embodiment is an in-vehicle communications system 1 to which the present invention is applied. In the in-vehicle communications system 1, nodes 3 are connected to each other via a transmission line (described as "bus communications line") 5 using bus topology.

The nodes 3 are body ECUs, peripheral equipment (such as a light and a sensor), and so on. The body ECUs are electronic control units that perform applications in the body of the vehicle. The body ECUs include, for example, include a body and wiper ECU, a seating ECU, a slide door ECU, a mirror ECU, a tail gate ECU, a light ECU and a tilt and telescopic steering ECU (electric steering positioning device). The peripheral equipment is provided for detecting status of a vehicle or controlling status of the vehicle. The peripheral equipment includes, for example, a light switch, a wiper switch, a light sensor and a rain sensor.

[Bus Communications Line]

The transmission line 5 is configured such that the signal level of the transmission line 5 becomes low when a high level (first level) signal and a low level (second level) signal are outputted from different nodes at the same time. The in-vehicle communications system executes bus arbitration by using this function.

Figure 3A:
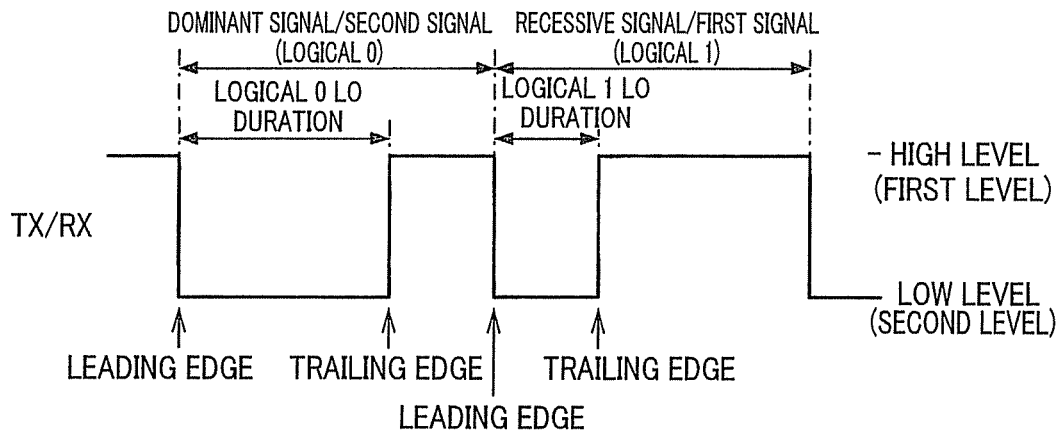
FIG. 3A is a schematic waveform diagram showing a line code used in communications via a transmission line.

In the transmission line 5, as shown in FIG. 3A, PWM (pulse width modulation) code is used as a line code. In the PWM code, the signal level changes from the first level (high level in this embodiment) to the second level (low level in this embodiment) between bits (bit periods: a bit period being a period corresponding to a bit, and in other words a pulse period). The signal level change showing a bit period functions as a reference clock signal described below. Then, the signal level changes from the second level to the first level within a bit. Each of two signals having different duty ratios expresses a respective signal (logical 1/logical 0) in the binary code. Hereinafter, one of the two signals, in which the ratio (duration) of the low level duration is smaller than that of the other, is described as a recessive signal (first signal), and the other is described as a dominant signal (second signal). In this embodiment, the recessive signal corresponds to the logical 1, and the dominant signal corresponds to the logical 0. Furthermore, in the line code, an edge which changes from the high level to the low level is described as a leading edge, and an edge which changes from the low level to the high level is described as a trailing edge.

Specifically, the recessive signal is set at the low level in one-third of the total period of a bit signal, and at the high level in the other two-thirds. The dominant signal is set at the low level in two-thirds of the total period of a bit signal, and at the high level in the other one-third. The dominant signal wins the bus arbitration, when the recessive signal and the dominant signal collide with each other on the transmission line 5.

A term where an acceptable number (11 in this embodiment) or more of the recessive signals continue on the transmission line 5 is referred to IFS (Inter Frame Space), the state where the IFS has been detected is referred to an idle state. In the in-vehicle communications system 1, an access control according to CSMA/CA is adapted. In the access control, each node 3 is allowed to send signals when the transmission line 5 is at the idle state. Then, if the node 3 detects its loss of the bus arbitration after starting to send, the node 3 stops to send immediately. Only the node 3 that has won the bus arbitration is allowed to continue to send.

Figure 3B:
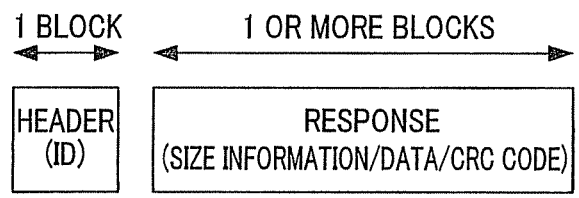
FIG. 3B is a schematic diagram showing a frame format sent and received via a transmission line.

Frames used in communications between the nodes 3, as shown in FIG. 3B, includes a header for designating the data allowed to be sent, and a variable-length response for sending the data designated by the header.

Among them, the header includes identification (ID) of data which allowed to be sent, and the bus arbitration is performed on the basis of the value of the ID. On the other hand, the response includes at least size information showing the size of the data (or the response) and CRC (cyclic redundancy code) for checking the presence of errors besides the data.

Figure 1:
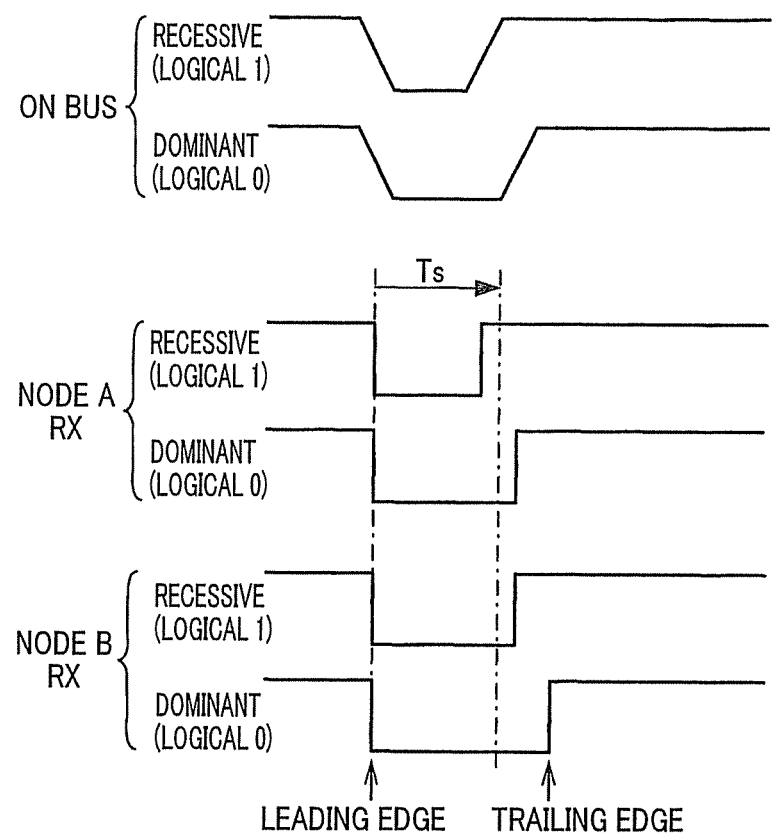
FIG. 1 is a waveform diagram for explaining an object of the present invention.
Figure 2:
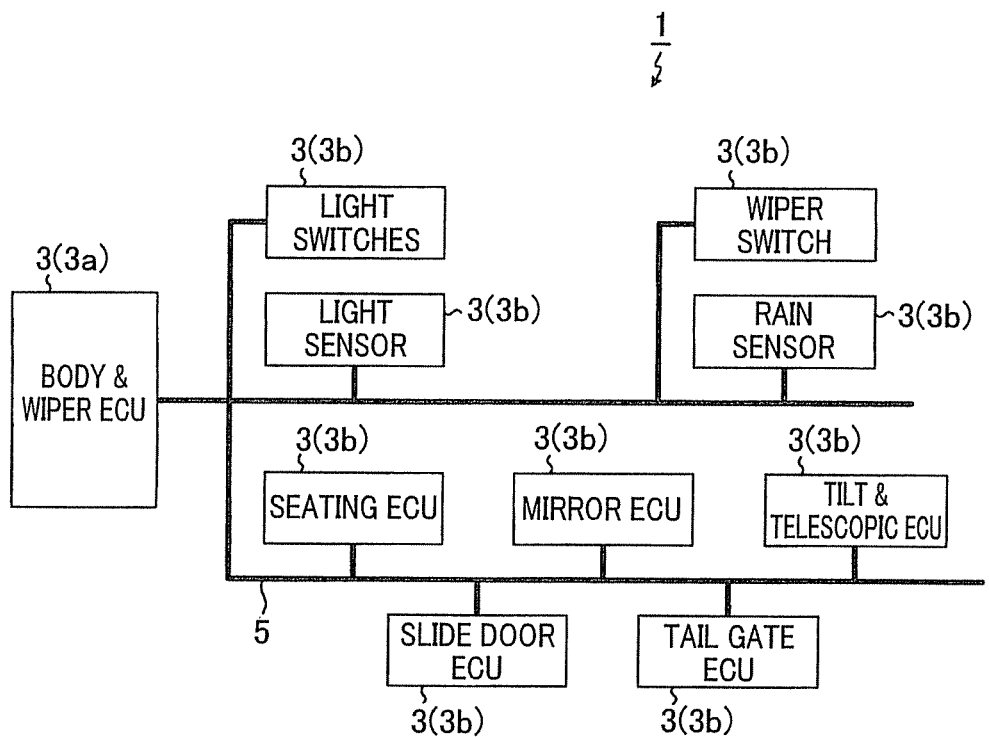
FIG. 2 is a schematic block diagram showing a configuration of an in-vehicle communications system.

There are two types of the nodes 3, one of them is a node 3a (the body and wiper ECU in FIG. 2) that supplies clock signals to the other nodes 3b via the transmission line 5, and the other is a node 3b that communicates in synchronization with clock signals supplied via the transmission line 5. Sometimes the leading node 3a is referred to a clock master 3a, and the latter node 3b is referred to a normal node 3b. The clock master 3a and the normal node 3b have similar configurations to each other except for a part of the configurations. Therefore, in this document, basically, the common parts of the configurations are described, and as needed, the different parts are described.

Figure 4:
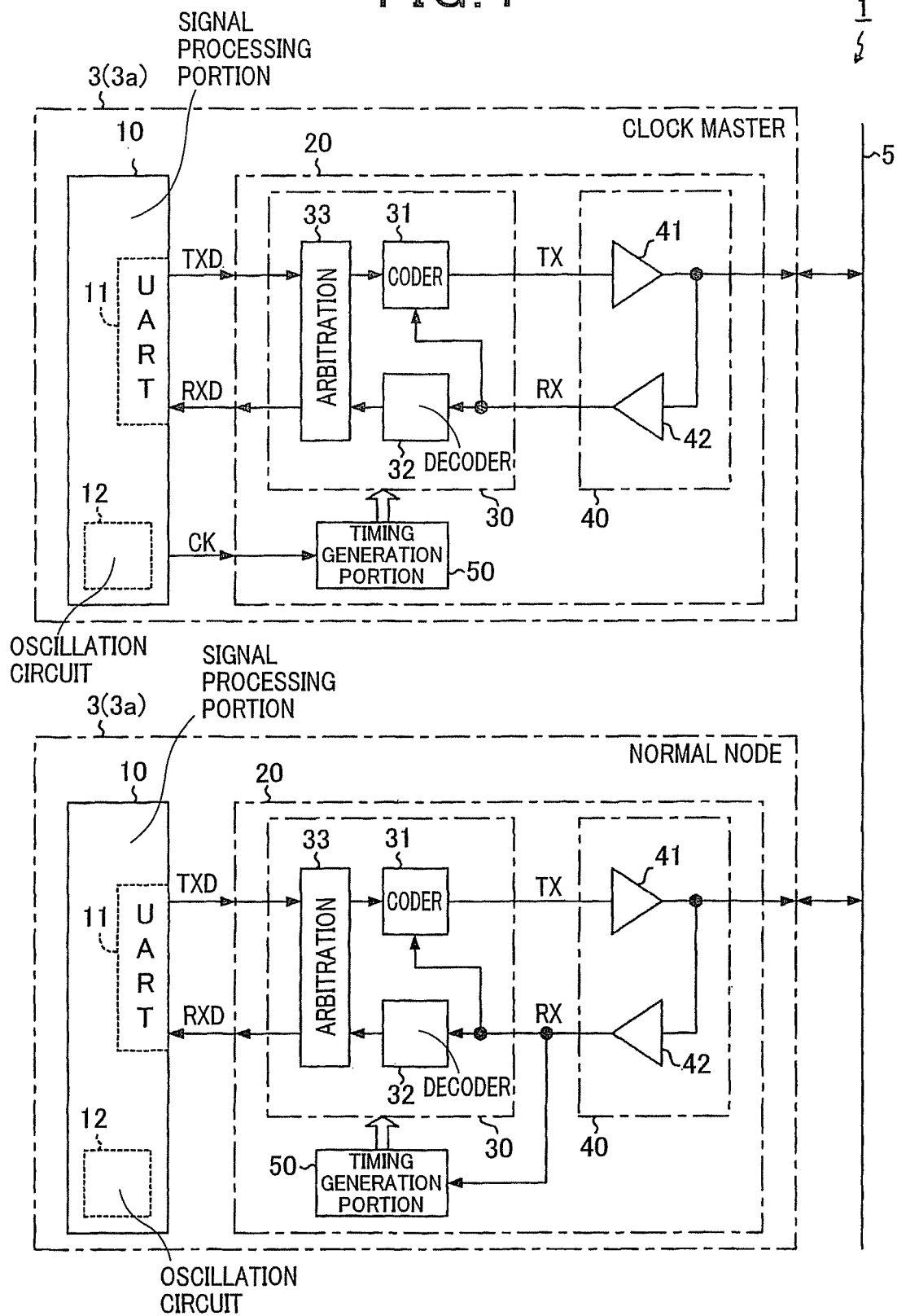
FIG. 4 is a block diagram showing configurations of nodes.
Figure 5:
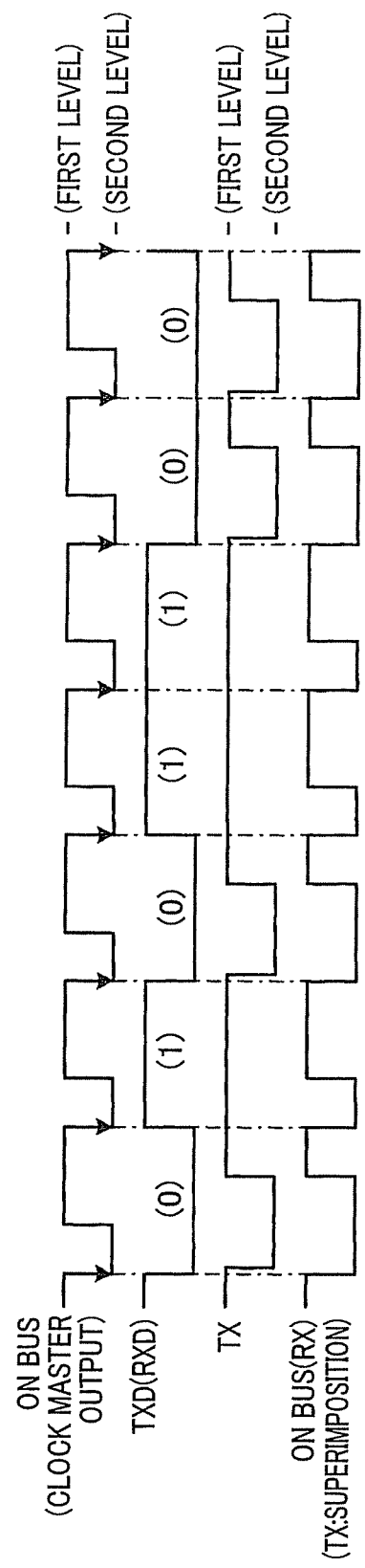
FIG. 5 is a timing chart showing behavior of an encoder.

The node 3 has a signal processing portion 10 and a transceiver 20, as shown in FIG. 4. The signal processing portion 10 executes assigned processes on the basis of information obtained by communication with the other nodes 3 via the transmission line 5. The transceiver 20 receives the transmit data TXD supplied from the signal processing portion 10, codes the transmit data TXD in the NRZ code as one of the binary code to transmit data TX in the PWM code as shown in FIG. 5, and outputs the coded transmit data TX on the transmission line 5. Furthermore, the transceiver 20 obtains the receive data RX in the PWM code from the transmission line 5, decodes the receive data RX in the PWM code to the receive data RXD in the NRZ code as shown in FIG. 5, and supplies the receive data RXD to the signal processing portion 10.

[Signal Processing Portion]

The signal processing portion 10 has a microcomputer including a CPU, a ROM, a RAM, I/O port and so on as a main part, furthermore, UART (Universal Asynchronous Receiver Transmitter) 11, and an oscillation circuit 12.

Figure 3C:
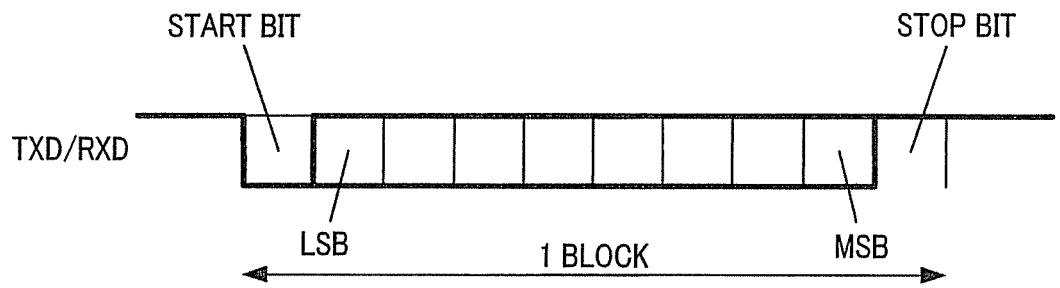
FIG. 3C is a schematic diagram showing a block format sent and received between an UART and a transceiver.

The UART 11 performs serial communications adapting start-stop (asynchronous) method. The UART 11 sends and receives data by the 10-bit block, as shown in FIG. 3C. A block includes a start bit (low level) to signal the beginning of the block, a stop bit (high level) to signal the ending of the block, and 8-bit data between the start bit and the stop bit. In the 8-bit data which is a main part of the block, the LSB (least significant bit) is set at the head of the 8-bit data, and the MSB (most significant bit) is at the tail of the 8-bit data.

The header of the above-described frame (refer to FIG. 3B) is composed of a block, 7 bits of the 8-bit data is used as the ID, and the other bit is used as a parity bit. The response of the frame is composed of one or more blocks, and the size information is set in the first block.

The oscillation circuit 12 generates operation clock signals for operating the signal processing portion 10. Furthermore, in the clock master 3a, besides the operation clock signals, the oscillation circuit 12 generates internal clock signals to be supplied to the transceiver 20. The clock rate of the internal clock signals is set to be the same as the communications rate of the UART 11.

[Transceiver]

The transceiver 20, as shown in FIG. 4, has a digital processing portion 30, an analog processing portion 40 and a timing generation portion 50 that generates timing signals needed for the operation of the digital processing portion 30. The digital processing portion 30 has an encoder 31 that codes the transmit data TXD, a decoder 32 that decodes the receive data RX, and an arbitration circuit 33 that detects a collision of data by a bit. The analog processing portion 40 has a transmitter buffer 41 that transmits on the transmission line 5 the transmit data TX coded with the digital processing portion 30, and a receive buffer 42 that obtains data on the transmission line 5.

Furthermore, the analog processing portion 40 of the clock master 3a is provided with a clock supplying circuit (not shown in the drawings) that always supplies the recessive signals to the transmission line 5 as clock signals to be supplied to the other nodes 3b.

[Timing Generation Portion]

The timing generation portion 50 has a simplified oscillation circuit such as a ring oscillator having a plurality of inverters which are connected in a chain, and the oscillation circuit generates count clock signals. The timing generation portion 50 divides the generated count clock signals by frequency circuits to generate timing signals synchronized with the reference clock signals. In the clock master 3a, the reference clock signals are the internal clock signals CK supplied from the signal processing portion 10. In the normal node 3b, the reference clock signals are the receive data RX obtained from the transmission line 5 through the receive buffer 42.

[Digital Processing Portion]

In the digital processing portion 30, the encoders 31 of the clock master 3a and the normal node 3b operate in different ways from each other.

At first, the encoder 31 of the clock master 3a generates the recessive signal, if the transmit data TXD (NRZ code) supplied from the signal processing portion 10 is logical 1. The encoder 31 of the clock master 3a generates the dominant signal, if the transmit data TXD is logical 0. Then, the encoder 31 of the clock master 3a supplies the generated data as the transmit data TX to the transmitter buffer 41.

The input of the encoder 31 of the clock master 3a is logical 1, if the signal processing portion 10 supplies no transmit data TXD. That is to say, when the signal processing portion 10 doesn't send, the encoder 31 of the clock master 3a continues to output the recessive signals which are reference clock signals supplied to the other nodes 3b.

On the other hand, the encoder 31 of the normal node 3b generates a signal at the first level during the whole term of a bit, when the transmit data TXD supplied from the digital processing portion 10 is the logical 1, as shown in FIG. 5. When the transmit data TXD is the logical 0, the encoder 31 of the normal node 3b supplies the following signal as the coded transmit data TX to the transmitter buffer 41. The signal changes to the second level in response to detecting a falling edge of the transmit data TXD, maintains the second level, then changes to the first level at the timing when the duration of the low level signal in the dominant signal has elapsed.

Then, when the coded transmit data TX is superposed on the recessive signals outputted from the clock master 3a on the transmission line 5, the recessive signal is transmitted on the transmission line 5 without change during the term corresponding to the term when the transmit data TXD is the logical 1, while the recessive signal is changed to the dominant signal to be transmitted on the transmission line 5 during the term corresponding to the term when the transmit data TXD is the logical 0.

The decoder 32 decodes the receive data RX (PWM code) obtained by the receive buffer 42 into the signal processing portion 10 activity (in this embodiment, NRZ code), and to supply the decoded receive data RXD to the signal processing portion 10. Specifically, the decoder 32 measures the duration of the low level signal from the leading edge of the receive data RX. Then, if the measurement result is equal to or larger than a predetermined threshold value, the decoder 32 decodes into the logical 0, and if the measurement result is smaller than the predetermined threshold value, then the decoder 32 decodes into the logical 1.

The arbitration circuit 33 compares the transmit data TXD with the receive data RXD by a bit. Then, if the arbitration circuit 33 determines the signal levels of the transmit data TXD and the receive data RXD are different from each other, the arbitration circuit 33 stops to supply the transmit data TXD to the encoder 31.

[Decoder]

Figure 6:
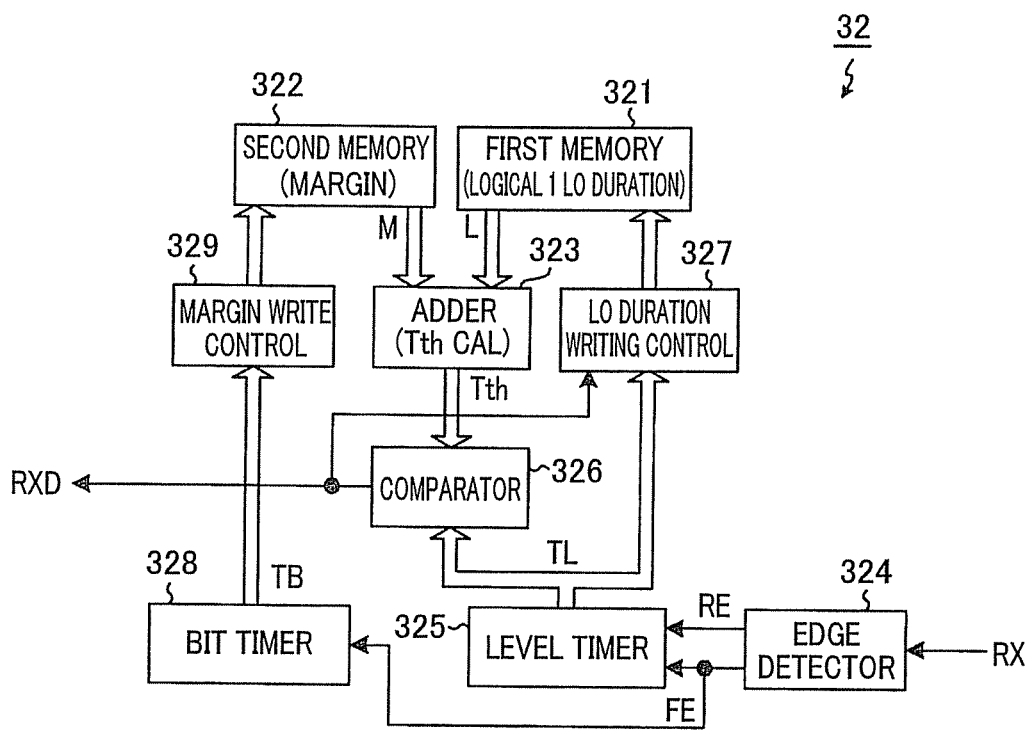
FIG. 6 is a block diagram showing configurations of a decoder.

The decoder 32, as shown in FIG. 6, has a first memory 321, a second memory 322, and an adder 323. The first memory 321 holds information about logical 1 LO duration which is the duration (from the leading edge to the trailing edge of the receive data RXD) of the low level signal in the recessive signal. The second memory 322 holds information about a margin which is an allowable margin for determining either the dominant signal or the recessive signal. In this embodiment, about half of the difference between the logical 0 LO duration, which is the duration of the low level signal in the dominant signal, and the logical 1 LO duration is stored in the second memory 322 as the margin. The adder 323 calculates a decoding threshold value Tth by adding the stored value (the logical 1 LO duration) L in the first memory 321 to the stored value (the margin) M in the second memory 322.

The decoder 32, furthermore, has an edge detector 324, a level timer (first timer) 325, and a comparator 326. The edge detector 324 detects the leading edge FE and the trailing edge RE. The level timer 325 measures the duration from the leading edge FE and the trailing edge RE. The comparator 326 compares a measured duration TL which is the value measured in the level timer 325 with the decoding threshold value Tth set in the adder 323. The comparison is executed at a predetermined timing set between the trailing edge of the present bit and the leading edge of the next bit. The comparator 326 determines the signal is the first signal when the measured duration TL is smaller than the decoding threshold value Tth, and determines the signal is the second signal when the measured duration TL is equal to or larger than the decoding threshold value Tth. Then, the comparator 326 outputs the binary code, which has a value depending on the comparison result (the first signal corresponds to the logical 1, the second signal corresponds to the logical 0), as the decoded receive data RXD.

Furthermore, the decoder 32 has an LO duration writing control portion 327, a bit timer (second timer) 328 and a margin writing control portion 329. The LO duration writing control portion 327 controls to write the measured duration TL to the first memory 321, on the basis of the output from the comparator 326. The bit timer 328 measures the interval between the leading edges. The margin writing control portion 329 controls the bit timer 328 to write a bit period TB, which is a measured value in the bit timer 328, to the second memory 322.

The timing generation portion 50 supplies timing signals which operate each portion and include clock signals to operate the level timer 325 and the bit timer 328.

[LO Duration Writing Control Portion]

Figure 7:
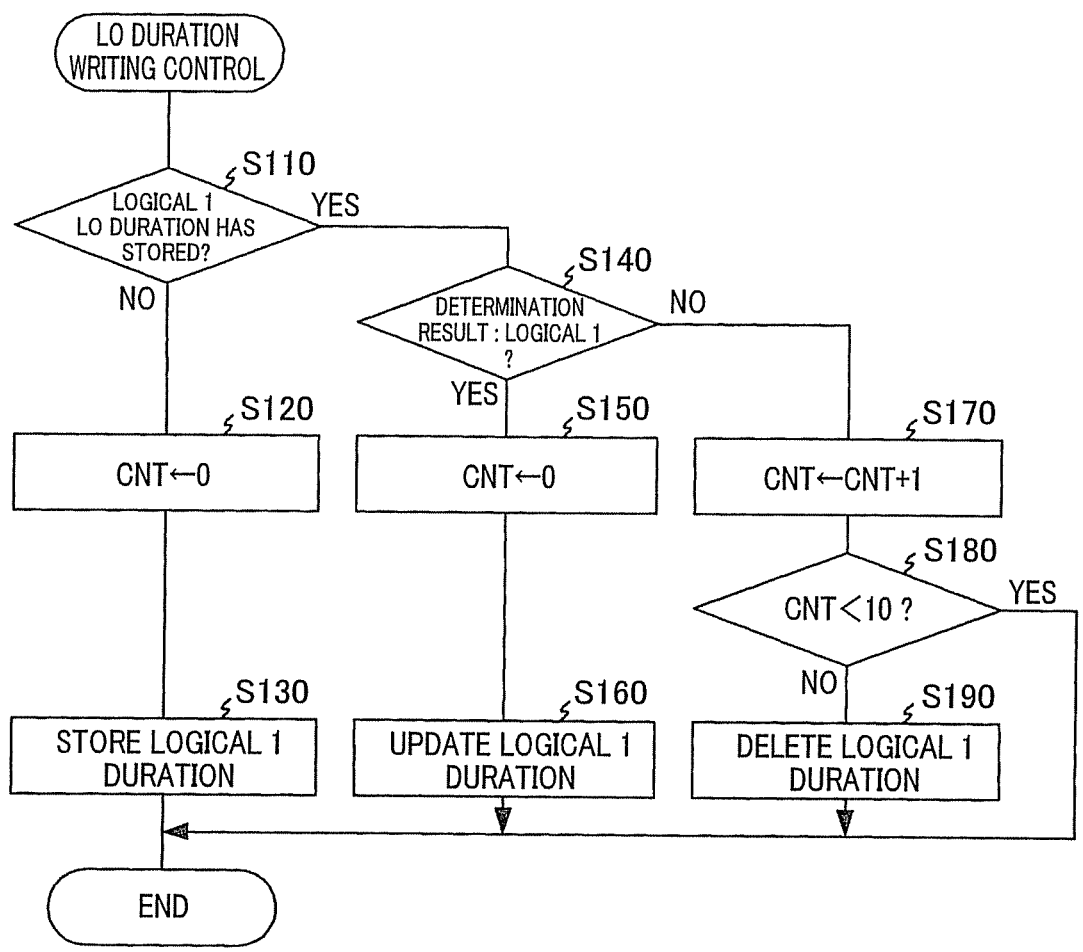
FIG. 7 is a flow chart showing processes in a LO duration writing control portion.

Processes executed in the LO duration writing control portion 327 is described, referring to the flow chart shown in FIG. 7.

The LO duration writing control portion 327 starts these processes in response to receiving the measured bit period from the level timer 325.

At the beginning of these processes, the LO duration writing control portion 327 determines whether the logical 1. LO duration is stored on the first memory 321 (S110). If it hasn't been stored, the LO duration writing control portion 327 clears the value of a counter CNT which holds a number of consecutive logical 0 (the second signal) (S120), stores the measured duration TL supplied from the level timer 325 as the logical 1 LO duration on the first memory 321 (S130), then halts these processes until the next iteration.

If the LO duration writing control portion 327 determines the logical 1 LO duration has been stored on the first memory 321 in the step S110, the LO duration writing control portion 327 determines whether or not the output (the comparison result) from the comparator 326 corresponds to the logical 1 (S140). If it corresponds to logical 1, the LO duration writing control portion 327 clears the value of the counter CNT (S150), updates the logical 1 LO duration stored on the first memory 321 to the measured duration TL supplied from the level timer 325 (S160), then halts these processes until the next iteration.

If the LO duration writing control portion 327 determines the output from the comparator 326 corresponds to the logical 0 in the step S140, the LO duration writing control portion 327 increments the value of the counter CNT (S170), then determines whether the value of the counter CNT is smaller than an upper limit (ten in this embodiment) which has been set preliminarily (S180). This upper limit is set on the basis of the fact that ten or more logical 0 aren't outputted continuously in this system (refer to FIG. 3C).

If the value of the counter CNT is smaller than the upper limit, the LO duration writing control portion 327 halts these processes until the next iteration. If not, the LO duration writing control portion 327 deletes the values stored on the first memory 321 (S190), then halts these processes until the next iteration.

That is to say, the LO duration writing control portion 327 initializes the value stored on the first memory 321 (S130), because the logical 1 LO duration has not been stored on the first memory 321 immediately after the boot of the decoder 32 (S110: NO). Specifically, the LO duration writing control portion 327 stores the measured duration TL supplied from the level timer 325 as an initial value of the logical 1 LO duration. Then, every time the output of the comparator 326 is the logical 1 (S140: YES), the LO duration writing control portion 327 updates the stored value of the first memory 321 to the measured duration of the level timer 325 at that time (S160).

If ten or more outputs of the comparator 326 are the logical 0 continuously (S180: NO), the LO duration writing control portion 327 deletes the value stored on the first memory 321 (S190), because the stored logical 1 LO duration is abnormal. Therefore, the LO duration writing control portion 327 return to initialize the value stored on the first memory 321.

[Margin Writing Control Portion]

The margin writing control portion 329 updates the margin stored on the second memory 322 to a value depending on the actual bit period obtained in the bit timer 328. Specifically, the margin writing control portion 329 writes to the second memory 322 a value which is obtained by multiplying a last bit period TB supplied from the bit timer 328 by a preliminarily set coefficient K (0<K<1: for example, K=0.05).

[Effects]

Figure 8:
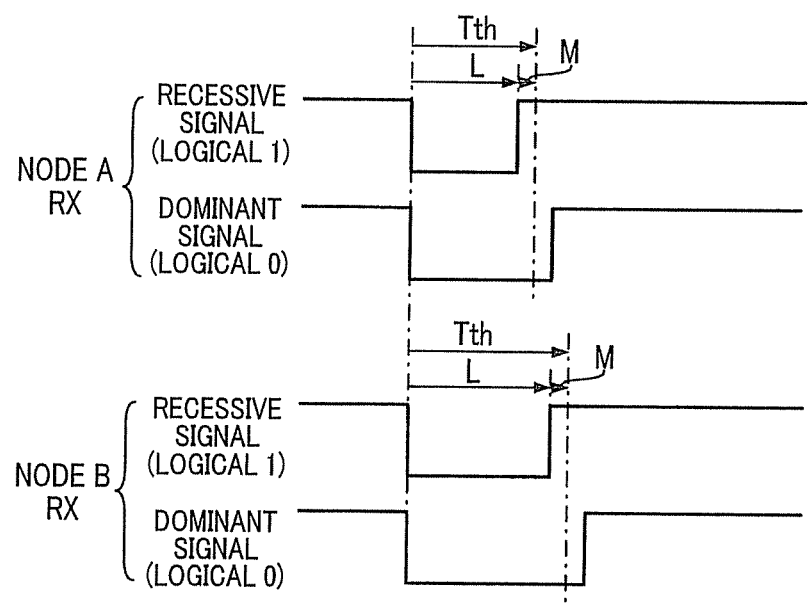
FIG. 8 is a timing chart showing behavior of the decoder.

As discussed above, according to the in-vehicle communications system, in each node 3, the decoding threshold value Tth of its own node 3 is set on the basis of the actual measured value L (refer to FIG. 8) of a logical 1 LO duration and the margin M calculated from the actual measured value of a bit period. This can make each decoding threshold value Tth appropriate for the circuit characteristics of each node 3. Therefore, each node 3 can accurately encode the PWM code despite of variability of the circuit characteristics among the nodes 3.

Furthermore, each node 3 composing the in-vehicle communications system 1 initializes the value stored on the first memory 321 when the number of times the input signal is continuously determined as the logical 0 (the second signal) exceeds an upper limit. For this, even if the node 3 runs into an abnormal state, for example, where the node 3 mistakenly determines the normal recessive signal as the dominant signal on the basis of an excessively small value written to the first memory 321 because of noise etc., the node can recover from the abnormal state. Therefore, reliability of this in-vehicle communications system is ensured.

Furthermore, the node 3 updates the margin M, the value stored on the second memory 322, on the basis of the measurement result (the bit period TB) of the bit period. Therefore, if the period of the reference clock signal changes because of some cause, the node 3 can set the decoding threshold value Tth to be appropriate for the changing period.

[Modifications]

Though the invention has been described with respect to the specific preferred embodiments, many variations and modifications will become apparent to those skilled in the art upon reading the present application. It is therefore the intention that the claims be interpreted as broadly as possible in view of the prior art to include all such variations and modifications.

For example, though relative proportions of ⅓ for the recessive signal, and ⅔ for the dominant signal are set as the duration at the low level in a bit of the line code in the above-described embodiment, the present invention is not limited to this. Alternatively, for example, ¼ for the recessive signal, ⅔ for the dominant signal may be used.

The binary code may be not only the NRZ code but also RZ code, CMI code and so on.

In the above-described embodiment, the LO duration writing control portion 327 updates the value L (the logical 1 LO duration) stored on the first memory 321, every time the logical 1 is outputted. Alternatively, every time a plurality of the logical 1 signals are outputted, the LO duration writing control portion 327 may statistically process the measured values obtained during the output of the logical 1 signals, and may update to the statistically-processed value (for example, an average value).

In the above-described embodiment, the margin writing control portion 329 updates, every time the decoder 32 receives a pulse (a bit), the value (the margin) M stored on the second memory 322 by using the bit period TB of the last bit. Alternatively, the margin writing control portion 329 may update, every time the decoder 32 receives a plurality of pluses (bits), to the value M on the basis of a value (for example, an average value) calculated by statistically processing the bit periods TB, or may update only when receiving an external command. Furthermore, in a system whose period of the reference clock signal is comparatively constant, a fixed value may be used as the margin M. In this case, the bit timer 328 and the margin writing control portion 329 may be cut out from the encoder 32, this can make the device configuration simple.

In the above-described embodiment, the node 3 uses the value stored (the logical 1 LO duration) on the first memory 321 only for generating the decoding threshold value Tth. Furthermore, the node may determine the duration at the low level (the second level) of the dominant signal (the second signal) when codes the transmit data TXD, on the basis of the value stored (the logical 1 LO duration) on the first memory 321.

What is claimed is:

1. A decoder for decoding an input signal coded with a pulse width modulation (PWM) code as a line code to an output signal in a binary code, the input signal in a transmission line being outputted from a clock master or a normal node communicating with each other via the transmission line, the decoder comprising:
    a first memory on which information on a duty duration of the PWM code is stored, a first signal and a second signal in the PWM code being assigned with the respective signals in the binary code depending on their duty ratio, the duty ratio being the ratio of the duty duration to a pulse period, the first signal being supplied from the clock master, the second signal being generated by changing the supplied first signal by the normal node, the information on the duty duration of the first signal being stored on the first memory;
    a first timer that measures the duty duration of the input signal;
    a determination circuit that determines which output signals corresponds to the input signal, on the basis of the information stored on the first memory and the duty duration measured with the first timer;
    a first controller that updates the information stored on the first memory, on the basis of the determination result and the measured duty duration.

2. The decoder according to claim 1, wherein, the determination circuit comprises:
    a setting circuit that sets a decoding threshold value for decoding the input signal, on the basis of the information stored on the first memory; and
    a comparator that compares the duty duration counted with the first timer with the decoding threshold value to determine the output signal.

3. The decoder according to claim 1, wherein, the first controller is configured to update the information on the first memory, every time the determination circuit determines the input signal corresponds to the stored output signal.

4. The decoder according to claim 1, wherein, the PWM code has two signals different in duty ratio, and each signal in the PWM code corresponds to a respective signal in the binary code.

5. A decoder for decoding an input signal coded with a pulse width modulation (PWM) code as a line code to an output signal in a binary code, comprising:
    a first memory on which information on a duty duration of the PWM code is stored, signals in the PWM code being assigned with the respective signals in the binary code depending on their duty ratio, the duty ratio being the ratio of the duty duration to a pulse period;
    a first timer that measures the duty duration of the input signal;
    a determination circuit that determines which output signals corresponds to the input signal, on the basis of the information stored on the first memory and the duty duration measured with the first timer; and
    a first controller that updates the information stored on the first memory, on the basis of the determination result and the measured duty duration, the first controller being configured to delete the information stored on the first memory and to store a new duty duration measured by the first timer on the first memory, when a number of bits which the determination circuit have determined as a same input signals continuously exceeds a predetermined upper limit.

6. A decoder for decoding an input signal coded with a pulse width modulation (PWM) code as a line code to an output signal in a binary code, comprising:
    a first memory on which information on a duty duration of the PWM code is stored, signals in the PWM code being assigned with the respective signals in the binary code depending on their duty ratio, the duty ratio being the ratio of the duty duration to a pulse period;
    a first timer that measures the duty duration of the input signal;
    a determination circuit that determines which output signals corresponds to the input signal, on the basis of the information stored on the first memory and the duty duration measured with the first timer;
    a first controller that updates the information stored on the first memory, on the basis of the determination result and the measured duty duration; and
    a second timer that measures the pulse period of the input signal,
    wherein, the determination circuit comprises:
    a setting circuit that sets a decoding threshold value for decoding the input signal, on the basis of the information stored on the first memory and the pulse period measured with the second timer; and
    a comparator that compares the duty duration counted with the first timer with the decoding threshold value to determine the output signal.

7. A communications system, comprising:
    nodes that communicate with each other via a transmission line on which a pulse width modulation (PWM) code is used, nodes including a clock master and normal nodes, the clock master supplying a first signal in the PWM code to the transmission line, the normal nodes, changing the first signal to a second signal in the PWM code; and
    a decoder provided in at least one normal node, the decoder decoding an input signal from the transmission line to an output signal in a binary code, the first and the second signals in the PWM code being assigned with the respective signals in the binary code depending on their duty ratio, the duty ratio being the ratio of a duty duration to a pulse period;
    wherein the decoder comprising:
    a first memory on which information on the duty duration of the first signal of the PWM code is stored;
    a first timer that measures the duty duration of the input signal received in the own node;
    a determination circuit that determines which output signals corresponds to the input signal, on the basis of the information stored on the first memory and the duty duration measured with the first timer;

a first controller that updates the information stored on the first memory, on the basis of the determination result and the measured duty duration.

\* \* \* \* \*